United States Patent
Forghani-Zadeh et al.

(10) Patent No.: US 10,673,423 B2
(45) Date of Patent: Jun. 2, 2020

(54) FAST TURN-ON POWER SWITCH

(71) Applicant: Texas Instruments Incorporated, Dallas, TX (US)

(72) Inventors: Hassan Pooya Forghani-Zadeh, Fort Worth, TX (US); Sujan Kundapur Manohar, Dallas, TX (US); Ariel Dario Moctezuma, Garland, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 41 days.

(21) Appl. No.: 15/234,722

(22) Filed: Aug. 11, 2016

(65) Prior Publication Data

US 2017/0317583 A1   Nov. 2, 2017

Related U.S. Application Data

(60) Provisional application No. 62/328,711, filed on Apr. 28, 2016.

(51) Int. Cl.
   *G05F 1/10* (2006.01)
   *H03K 5/08* (2006.01)
   *H03K 17/042* (2006.01)

(52) U.S. Cl.
   CPC .......... *H03K 5/08* (2013.01); *H03K 17/04206* (2013.01)

(58) Field of Classification Search
   CPC ........ H03F 3/245; H03F 3/195; H03F 1/0227; H03F 1/0277
   See application file for complete search history.

(56) References Cited

U.S. PATENT DOCUMENTS

| | | | |
|---|---|---|---|
| 8,008,953 B1 * | 8/2011 | Brumett, Jr. ......... | H03K 17/166 327/109 |
| 2006/0261788 A1 | 11/2006 | May | |
| 2007/0252564 A1 * | 11/2007 | De Nisi ................. | H02M 1/10 323/268 |

(Continued)

FOREIGN PATENT DOCUMENTS

WO   2008117139 A2   10/2008

OTHER PUBLICATIONS

STIC search report.*

(Continued)

*Primary Examiner* — Sibin Chen
(74) *Attorney, Agent, or Firm* — Michael A. Davis, Jr.; Charles A. Brill; Frank D. Cimino

(57) ABSTRACT

In described examples, in response to a voltage at an external power terminal falling below a safe limit: a charge pump is operated at a first frequency to produce a voltage at a charge pump node; and a first controlled current is coupled from the charge pump node to a control terminal of a power switch transistor. The power switch transistor has a conduction path coupled between the external power terminal and an internal power terminal at which an internal power source is connected. In response to the voltage at the external power terminal reaching a selected level: the charge pump is operated at a second frequency, lower than the first frequency; and a second controlled current, lower than the first controlled current, is coupled from the charge pump node to the control terminal of the power switch transistor.

17 Claims, 4 Drawing Sheets

(56) References Cited

U.S. PATENT DOCUMENTS

| | | |
|---|---|---|
| 2009/0128212 A1 | 5/2009 | Liu et al. |
| 2010/0060233 A1 | 3/2010 | Kung et al. |
| 2011/0109376 A1 | 5/2011 | Li |
| 2012/0319762 A1 | 12/2012 | Watanabe et al. |
| 2014/0208134 A1 | 7/2014 | Waters et al. |
| 2016/0065058 A1* | 3/2016 | Van Kampen .......... B81B 7/008 327/536 |
| 2016/0188514 A1* | 6/2016 | Forghani-Zadeh ... G06F 13/385 710/313 |
| 2017/0047731 A1* | 2/2017 | Manohar .................. H02H 9/02 |

OTHER PUBLICATIONS

International Search Report for PCP/US2017/029849 dated Aug. 17, 2017.

Universal Serial Bus Power Delivery Specification, Revision 3.0, V1.0a (Mar. 2016), pp. 1, 24, 205, 241, 242, 287-91, 413-418.

"TPS65982 USB Type-C and USB PD Controller, Power Switch, and High Speed Multiplexer", Data Sheet SLVSD02B (Texas Instruments Incorporated, May 2016).

Sadat, "Low-cost implementation of USB Type-C", Technical Paper SLLY016 (Texas Instruments Incorporated, Jul. 2015).

Campbell, "Transition Existing Products from USB 2.0 OTG to USB Type-C", Technical Paper SLLY017 (Texas Instruments Incorporated, Jul. 2015).

Sadat et al., "USB Type-C represents breakthrough connectivity", Technical Paper SLLY018 (Texas Instruments Incorporated, Dec. 2015).

"TPS65982 Designs for Supporting Voltages in USB-PD 'Power Rules'", Application Report SLVA782 (Texas Instruments Incorporated, Jun. 2016).

European Search Report for 17790432.3 dated Apr. 17, 2019.

* cited by examiner

FAST TURN-ON POWER SWITCH

CROSS-REFERENCE TO RELATED APPLICATIONS

This application claims priority, under 35 U.S.C. § 119(e), to U.S. Provisional Application No. 62/328,711, filed Apr. 28, 2016, incorporated herein by this reference.

BACKGROUND

This relates generally to integrated circuits in the interfacing of electronic systems and devices with one another, and more particularly to interface circuits for receiving power from and providing power to connected devices.

The interface of various electronic systems has become much more standardized in recent years with the widespread implementation of cables, connectors, and controllers according to the various Universal Serial Bus (USB) standards. A wide range of modern devices and systems, particularly those intended for consumer and office use, can now readily interface with one another over USB interfaces to communicate data and, in some instances, to allow one USB device to power another. Indeed, USB is used in charging the battery of many modern smartphones, either from a wall charger or from a host device (e.g., a desktop or laptop computer).

USB Type-C (or "USB-C") interfaces have been developed that offer many improvements over conventional USB interfaces (e.g., USB 1.0, USB 2.0), such improvements including reversible cables, "flippable" plugs (i.e., plugs that can be inserted in either orientation), and higher levels of power delivery, while maintaining backward-compatibility with USB 2.0 data communications. USB Type C interfaces allow a given port to function as a "downstream-facing port" (DFP), as at a host device, or as an "upstream-facing port" (UFP), as at an accessory device. In contrast to conventional USB connectors in which the shape of the plug identifies which device is the host and which is the accessory, two "channel configuration" ("CC") pins of the USB Type-C connectors electrically establish the host-accessory relationship for data and control communication. More specifically, host devices have pull-up resistors coupled to the CC pins while accessory devices have pull-down resistors coupled to those pins; monitoring of the voltage at these CC pins allows a device to detect connection to another device, and also the host-accessory relationship of that connection. USB Type-C also defines "dual-role ports" (DRPs) that can serve as either a DFP or a UFP, depending on the role of a device to which it is connected. Identification of the direction of a DRP is performed by the device alternately identifying as a DFP and then a UFP until a stable state is reached. Some DRPs have a preferential DFP or UFP state to facilitate negotiation in the connection of two DRPs to one another.

The USB Type-C standard provides the potential for a single charger to safely and rapidly charge a number of different devices, including laptops, smartphones, tablets, cameras, and any number of other functions. For example, under a power delivery option under USB Type-C, which option is named as USB PD (the "PD" meaning "power delivery"), power delivery of up to 100 W is possible, facilitating rapid charging of a wide range of battery-powered devices from that single charger. Under this USB PD option, a given port may function as: (a) a "provider" or "source" of power, such as at a charger; or (b) a "consumer" or "sink" of power, such as at a battery that is being charged by the power provider. The host-device and source-sink relationships are not required to co-align between devices, such that a host for data and control purposes may be the device being charged (i.e., the sink for power purposes). Identification and negotiation of the source-sink relationship for power delivery under USB PD is performed by controller circuitry in each device at the USB-C port. More specifically, this controller circuitry detects the direction of current flow at the CC pins of the USB Type-C connector to identify the source-sink power transfer relationship of a USB-C connection. After the roles are identified, a higher power level than the default USB-C level (15 W) is then negotiated under USB PD by the source device "advertising" its output power capability by its coupling of a selected pull-up resistor or current source value at the CC pins; conversely, the sink detects its level of current consumption by coupling a pull-down resistor to the CC pins pin at its end, and monitoring the voltage drop.

Under the USB PD standard, a "fast role swap" (FRS) operation is also specified. The purpose of this operation is to limit the interruption of power delivery to a power consumer upon removal of a power source from the connection. FIGS. 1A and 1B illustrate an example of a situation in which an FRS occurs. In FIG. 1A, host device 2 is a USB PD capable host system, such as a smartphone, that is powered by its battery 3 when not receiving external power. In this example, host device 2 is in the role of a host, but it can also operate as an accessory (e.g., when connected to a desktop or laptop computer), and accordingly has a dual-role USB-C port (DRP). In this example, DRP 10 of host 2 is connected to a dual-role port of USB PD capable hub 4. Hub 4 is a conventional USB hub under the USB-C and USB PD standards, and includes a number of ports for coupling various devices together. In this example, hub 4 has a downstream-facing port (DFP) coupled to accessory 6, and an upstream-facing port (UFP) coupled to power source 8. Also, in this example, accessory 6 is a bus-powered accessory device, such as an external drive, projector, printer, or other conventional accessory. In at least one example, power source 8 is a wall charger.

The power connections and direction of power transfer among these devices on USB-C line VBUS are shown in FIG. 1A (the data connections are not shown). Essentially, the VBUS lines among the devices are connected together through hub 4, such that the VBUS pins at each of the various ports are at the same voltage, as negotiated by those ports. FIG. 1A illustrates in this example that power source 8 is providing power via hub 6 to host device 2 and accessory 6. The power provided by power source 8 is sufficient to charge battery 3 and provide operating power for the functions of host 2 and accessory 6. This power transfer arrangement is the result of detection and negotiation under USB PD as described above, resulting in a VBUS voltage that is above a certain specification limit (e.g., vSafe5V) under the USB-C standard.

FIG. 1B illustrates the same system as in FIG. 1A, but after the removal of power source 8. In response to removal of power source 8, the voltage at the VBUS line at hub 4 will drop below the specification limit, because no device is acting as a power source. According to the USB PD standard, hub 4 will detect this drop in voltage on the VBUS line and cause its DRP to issue a "fast role swap" (FRS) signal to the DRP at host device 2 over the non-grounded CC wire. The FRS signal is intended to cause DRP 10 at host 2 to quickly configure itself as a power source, rather than a power sink, so its battery can begin supplying power to accessory 6 via hub 4 with minimal interruption.

FIG. 1C illustrates the general architecture of a portion of DRP 10 of host device 2 in the arrangement of FIG. 1A, for purposes of its function in identifying and negotiating power transfer. This architecture corresponds generally to the TPS65982 USB Type-C and USB PD controller, power switch, and high speed multiplexer available from Texas Instruments Incorporated. As shown in FIG. 1B, USB-C/PD controller 12 includes programmable and custom logic circuitry connected to the CC1 and CC2 pins of the USB-C connector, at which controller 12 detects connection of a USB-C cable and the orientation of the connection (i.e., host-accessory and source-sink). Also, controller 12 manages the USB PD "contracts" (i.e., power source capability and demand by the power sink) and controls power switch transistors 14a, 14b accordingly. Power switch transistor 14a operates as a power switch connecting the VBUS line at the USB-C connector to a power line V_SRC in host device 2, and power switch transistor 14b similarly operates as a power switch for connecting the VBUS line to a power line V_SNK; gate signals SRC_EN and SNK_EN are driven by controller 12 to control power switch transistors 14a, 14b accordingly. In this simplified architecture, upon determining that its device 2 is a power sink, controller 12 will issue an active level on line SNK_EN to turn on power switch transistor 14b and an inactive level on line SRC_EN to turn off power switch transistor 14a, connecting the VBUS line at the USB-C connector to line V_SNK and isolating the VBUS line from line V_SRC. Conversely, in response to determining that its device 2 is a power source, controller 12 issues an active level on line SRC_EN to turn on power switch transistor 14a and an inactive level on line SNK_EN to turn off power switch transistor 14b, connecting line V_SRC in host device 2 to the VBUS line at the USB-C connector, and isolating line V_SNK from the VBUS line. Some conventional USB PD ports, such as those supported by the TPS65982 device, include power switching transistors that support bidirectional power transfer, both as a source and a sink. In any case, the DRP at host 2 will connect either a pull-down resistor or a pull-up resistor to the CC lines according to the appropriate orientation.

In the status shown in FIG. 1A, controller 12 of DRP port 10 in FIG. 1C is a power sink, with transistor 14b on and transistor 14a off to enable receipt of power from the VBUS line at line V_SNK. In an FRS event such as described above relative to FIG. 1B, host 4 will issue the FRS signal over the non-grounded one of the CC1 and CC2 wires. On receipt of that signal, controller 12 initiates its fast role swap process, which includes ensuring that the VBUS line at its USB-C connector is at a safe voltage at which transistors 14a, 14b can be switched without damage to the internal circuitry of host device 2. When that condition is detected, transistor 14b is turned off and transistor 14a is turned on, allowing the battery of host device 2 to source power to accessory 6 over the VBUS line.

Under the most recent USB PD standard (*Universal Serial Bus Power Delivery Specification*, Revision 3.0, V1.0a (March 2016), incorporated herein by reference), 150 μsec is the maximum time delay from an FRS indication for a DRP port to switch from a power sink orientation to a power source orientation and begin sourcing power. This aggressive limit necessitates a switching time for transistor 14a of less than 100 μsec. Such rapid switching of a large high-voltage transistor requires significant current capability for the driving circuitry, and can cause undesirably high levels of in-rush current.

SUMMARY

In described examples, in response to a voltage at an external power terminal falling below a safe limit: a charge pump is operated at a first frequency to produce a voltage at a charge pump node; and a first controlled current is coupled from the charge pump node to a control terminal of a power switch transistor. The power switch transistor has a conduction path coupled between the external power terminal and an internal power terminal at which an internal power source is connected. In response to the voltage at the external power terminal reaching a selected level: the charge pump is operated at a second frequency, lower than the first frequency; and a second controlled current, lower than the first controlled current, is coupled from the charge pump node to the control terminal of the power switch transistor.

DETAILED DESCRIPTION OF EXAMPLE EMBODIMENTS

Described examples include a circuit and method of operation for quickly and controllably turning on a power switch transistor at an interface of an electronic device. In at least one described example, the circuit and method meet the specifications of modern interface standards, such as the Universal Serial Bus Power Delivery (USB PD) standard, regarding the switching the direction of power transfer from sink to source.

Further, in at least one described example of the circuit and method, reduced power consumption is achieved after a role swap from power consumer to power provider. Also, the circuit and method enable the use of high current-capable USB hubs while maintaining accurate operation.

In described examples, an interface port of an electronic device is capable of executing a role swap from receiving power over a power bus from an external power source to providing power to an external device over the power bus. The interface port includes first and second power switch transistors connected in series (between an internal power supply node and the power bus) to selectively couple the internal power supply node to the power bus. A switch and a controlled boost current source couple additional gate drive current to the first and second power switch transistors, respectively, in response to a "fast role swap" command indicating that rapid connection is required. The additional gate drive current is produced from a charge pump operating at an elevated frequency during the fast role swap, and is applied via a controlled current source to one of the power switch transistors. During the fast role swap, a current limit circuit turns off one of the power switch transistors if the sourced current (between the internal power supply node and the power bus) exceeds a programmed limit, with compensation for the boost current.

Example embodiments described in this specification are suitable for implementation into a Universal Serial Bus (USB) Type C interface at an electronic device operating according to the Universal Serial Bus Power Delivery (USB PD) standard, and such implementation is particularly advantageous in that context. Likewise, example embodiments are beneficially applicable to other applications involving the delivery of power among electronic devices, such as switching a device from being a consumer of external power to being a provider of power to externally connected devices.

Figure 2:
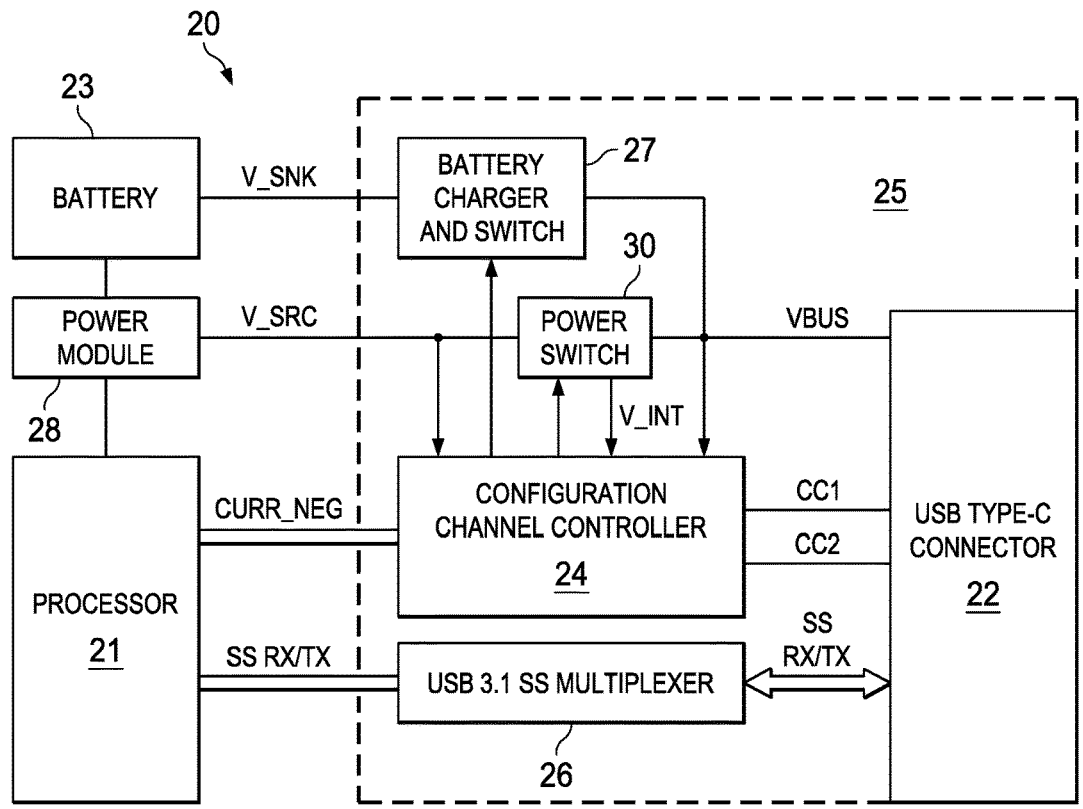
FIG. 2 is an electrical diagram, in block form, of a USB PD-capable electronic device in which an embodiment is implemented.

FIG. 2 illustrates the generalized architecture of host device 20 constructed according to these embodiments. Examples of host device 20 include a computer system such as a laptop or table computer, a smartphone, or other electronic device with its own internal power source, and accordingly includes the functional circuitry appropriate to its device function. In the example of host device 20, this functional circuitry includes processor 21, which is a programmable processor executing program instructions stored in a memory resource (not shown) to perform its desired function. Also, conventional circuit functions, such as used for input and output to and from host device 20, are included. As mentioned above, host device 20 includes an internal power source, which in this example consists of battery 23 and power module 28. Power module 28 includes the appropriate regulators and voltage converters for powering the functional circuitry of host device 20, such as processor 21 and its peripheral circuits.

Figure 1A:
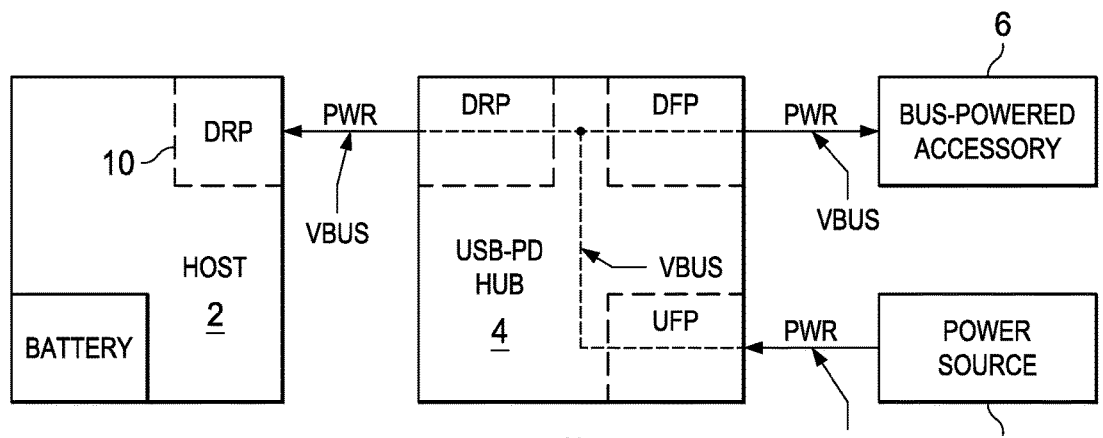
FIGS. 1A and 1B are electrical diagrams, in block form, of a conventional electronic system including a host device, an accessory device and a hub connecting the devices, and illustrating the direction of power transfer with and without an external power source coupled to the hub.
Figure 1B:
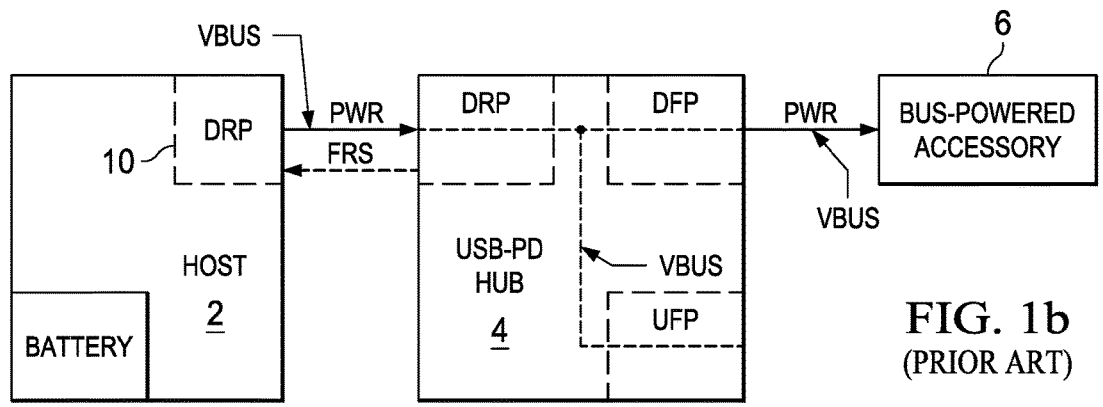
Figure 1C:
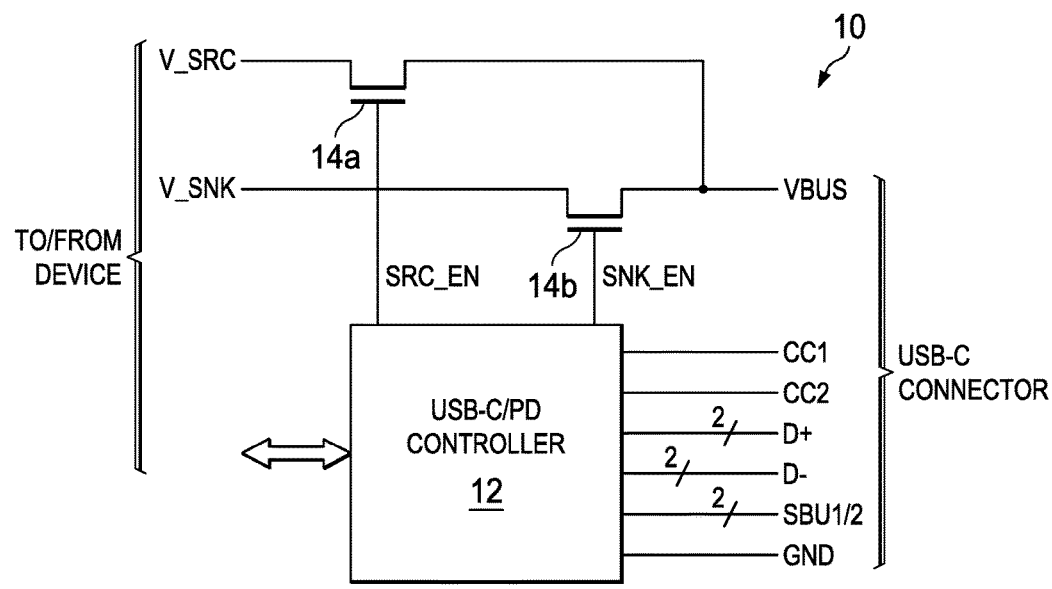
FIG. 1C is an electrical diagram, in block and schematic form, of a conventional interface port in the host device of the system of FIGS. 1A and 1B.

According to these embodiments, host device 20 includes USB Type C (USB-C) interface 25, in which circuitry for controlling the delivery of power to and from host device 20 is implemented according to an embodiment. In this example, interface 25 of host device 20 includes USB-C connector 22, which includes the appropriate terminals specified by the appropriate USB Type C standards for connecting to other USB-C devices, such as in the conventional arrangement of FIGS. 1A and 1B described above. These terminals include a power terminal VBUS, a pair of channel configuration terminals CC1, CC2, the appropriate reference voltage (i.e., ground) terminal, and data terminals shown generally in FIG. 2 as the SS RX/TX terminals.

In this embodiment, interface 25 includes configuration channel controller 24, which is coupled to configuration channel terminals CC1, CC2 of connector 22. Configuration channel controller 24 is constructed of the appropriate logic circuitry for managing the interface of host device 20 with other devices via the USB-C connection. For USB-C connections, the configuration channel lines (CC1, CC2) are used to determine whether a device is a host or an accessory for data and control purposes. For the case of a dual-role port (DRP), this determination is usually performed by controller 24 coupling either pull-up resistors or pull-down resistors to its configuration channel terminals CC1, CC2 and monitoring the voltage at those terminals. Also, as described in the above-incorporated USB PD standard, controller 24 uses the configuration channel terminals CC1, CC2 to determine whether its host device 20 is a provider of power to an accessory device from its internal power source (battery 23 and power module 28 in this example) over the USB-C connection, or a consumer of power from an external power source, and to "negotiate" the current level to be provided or consumed in that role. This operation is performed by controller 24 in combination with processor 23, as indicated by signal lines CURR_NEG between those two components of host device 20.

Also according to the USB PD standard, control signaling is performed over the channel configuration lines CC1, CC2, such signaling including the communication of a "fast role swap" signal from an external USB-C hub to host device 20. As described in the above-incorporated USB PD standard, this fast role swap signal is invoked when host device 20 is to change its role from that of a power consumer to a power provider, such as in the event of the removal of an external power source from a USB-C arrangement while an accessory device remains connected as a power consumer. In carrying out such a fast role swap according to these embodiments, the operation of controller 24 is described in further detail below.

Data communications over the USB-C connection are managed by USB 3.1 SS multiplexer 26 in interface 25. As shown generally in FIG. 2, multiplexer 26 is connected to certain data terminals at connector 22, including specifically the two pairs of transmit terminals and two pairs of receive terminals specified by the USB-C standard. Signals to be communicated at these "SS TX" conductors and signals received at these "SS RX" conductors controlled by multiplexer 26 in cooperation with processor 21, in the conventional manner. "Legacy" USB communications (e.g., USB 2.0) may be performed over data conductors running directly from connector 22 to and from processor 21, as described in the appropriate USB Type C standard.

As mentioned above, interface 25 of host device 20 also controls the transfer of power to and from host device 20, specifically between its internal power source of battery 23 and power module 28 and external devices. According to the above-incorporated USB PD standard, host device 20 may operate as a power consumer, in which case current is received from an external power source (e.g., power source 8) at the VBUS terminal of connector 22 for charging battery 23. In the architecture of FIG. 2, VBUS terminal of connector 22 is connected to battery charger and switch 27 of interface 25. When host device 20 is operating in the role of a power consumer, configuration channel controller 24 controls battery charger and switch 27 to forward current received at the VBUS terminal to battery 23 via line V_SNK.

Interface 25 also includes power switch 30, which is connected between power module 28 and the VBUS terminal of connector 22. Accordingly, when host device 20 is operating in the role of a power provider, configuration channel controller 24 controls power switch 30 to connect line V_SRC to the VBUS terminal of connector 22, such that power module 28 can provide current from battery 23, at a regulated voltage, to an accessory device connected to host device 20 via connector 22 and the appropriate connecting cable. Configuration channel controller 24 controls battery charger and switch 27 to be open when host device 20 is operating as a power provider; conversely, controller 24 causes power switch 30 to be open when host device is operating as a power consumer.

Figure 3:
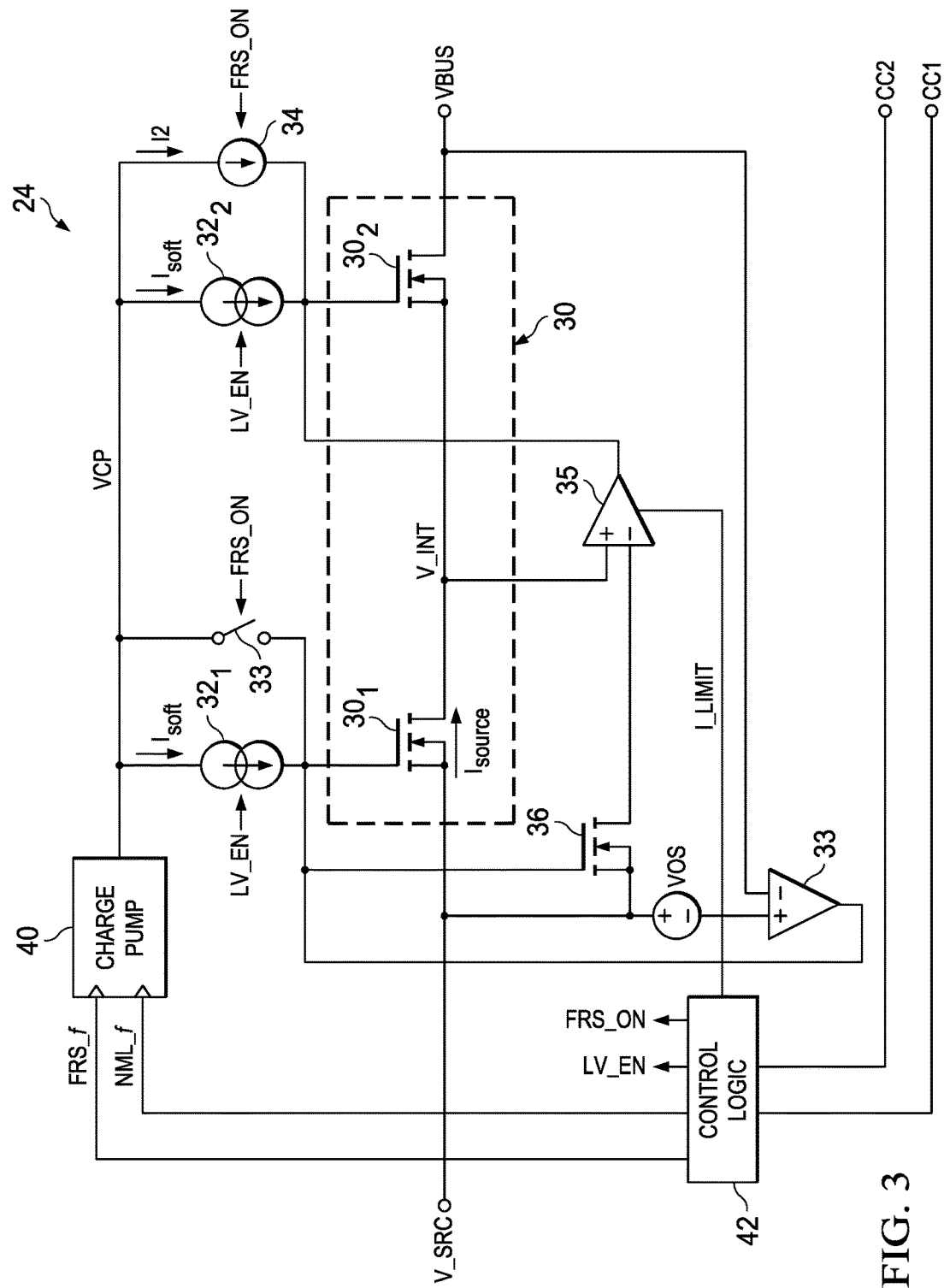
FIG. 3 is an electrical diagram, in block and schematic form, of power switching circuitry in an interface port of the electronic device of FIG. 2 according to an embodiment.

FIG. 3 illustrates the construction of power switch 30 and a portion of configuration channel controller 24 involved in the control of power switch 30 in providing power from battery 23 and power module 28 according to an embodiment. More specifically, power switch 30 of this embodiment includes two n-channel metal-oxide-semiconductor (MOS) transistors $30_1$, $30_2$ with their source/drain paths connected in series between the internal V_SRC conductor and the VBUS terminal to which power module 28 is connected. Power switch transistor 30$_1$ has its source at the internal V_SRC conductor and its drain connected to the source of power switch transistor 30$_2$; the drain of power switch transistor 30$_2$ is in turn connected to the VBUS terminal. Either or both of transistors 30$_1$, 30$_2$ may be a power transistor by having a relatively wide channel width to channel length (W/L) ratio, and is otherwise relatively robust to support the conduction of currents sufficient for host device 20 to power one or more accessory devices via a USB PD connection, and can withstand relatively large source/drain voltages as may be encountered upon the coupling of higher voltage external power sources to USB-C connector 22. For example, in view of the potential for high voltages and currents, either or both of transistors 30$_1$, 30$_2$ in power switch 30 may be constructed as a lateral double-diffused MOS transistor (DMOS, or LDMOS).

In this embodiment, configuration channel controller 24 includes reverse current protection circuit 33 and current limit circuit 35. Reverse current protection circuit 33 functions as a comparator in this implementation, comparing the voltage at the VBUS terminal with the voltage at the V_SRC conductor minus an offset voltage V$_{OS}$, and driving the gate of power switch transistor 30$_1$ according to that comparison. In this embodiment, reverse current protection circuit 33 operates to turn off power switch transistor 30$_1$ if the voltage at the VBUS terminal comes within the offset voltage V$_{OS}$ (e.g., about 10 mV) of the voltage at the internal V_SRC conductor, to ensure that reverse current is not conducted through power switch 30. In some implementations in which power is to be received via power switch 30, reverse current protection circuit 33 may operate to allow a controlled amount of reverse current from an external device to battery 23.

Current limit circuit 35 similarly functions as a comparator, comparing the voltage on either side of the source/drain path of power switch transistor 30$_1$ and controlling the gate of power switch transistor 30$_2$ accordingly. In the embodiment of FIG. 3, one input (the negative input) of current limit circuit 35 receives the voltage at the internal V_SRC conductor via pass transistor 36, and the other (positive) input receives the voltage at intermediate node V_INT between the source/drain paths of transistors 30$_1$, 30$_2$. The gate of pass transistor 36 is controlled by the output of reverse current protection circuit 33, and is turned off in the event of reverse current as described above. Accordingly, the differential voltage applied to current limit circuit 35 corresponds to the voltage drop across power switch transistor 30$_1$ when on, and thus to the source current I$_{source}$ being conducted from power module 28 to the external accessory connected to the VBUS terminal. As described in further detail below, current limit circuit 35 operates to throttle down power switch transistor 30$_2$ in response to current I$_{source}$ exceeding a limit I_LIMIT communicated from control logic 24, so current I$_{source}$ is regulated to that limit. In the USB PD context, this limit I_LIMIT will correspond to the negotiated current level between host device 20 and the accessory or accessories connected at USB-C connector 22.

According to this embodiment, controller 24 operates to turn on transistors 30$_1$, 30$_2$ by applying current to their respective gates produced by charge pump 40 at charge pump node VCP. Charge pump 40 is a conventional charge pump circuit constructed to any one of a number of conventional approaches for producing an elevated voltage at charge pump node VCP from a lower power supply voltage. In a general sense, charge pump 40 includes one or more switching devices clocked by an applied periodic signal in combination with a "flying" capacitor that charges and discharges in alternating phases of the periodic signal. In the first phase of a simple two-phase example, the switching devices connect the flying capacitor across the power supply voltage to charge toward that voltage; in the second phase, the capacitor is connected to be in series between the supply voltage and the load, which has the effect of raising the voltage at the load above the power supply voltage. The current sourced to the load increases with the frequency of the periodic signal applied to the charge pump. In the embodiment of FIG. 3, charge pump 40 is capable of operating at two different frequencies, such as provided from control logic 40 by signals NML_f, FRS_f; these two frequencies result in different levels of current being available from charge pump node VCP. For example, the NML_f, FRS_f signals may directly be clock signals at different frequencies, or may be control signals that otherwise set the frequency at which charge pump 40 switches. In one implementation, the FRS_f clock signal is at a frequency that is three to four times that of the FRS_f normal mode clock signal. In operation, as described in further detail below, the higher-frequency FRS_f signal is enabled during a fast role swap event to increase the switching frequency of charge pump 40 and thus increase the current it can source at charge pump node 40. Following the fast role swap, the FRS_f signal is de-asserted and the FRS_f signal is asserted, slowing the switching frequency of charge pump 40 and reducing its output current, to reduce the power consumption of interface 25.

The gate of power switch transistor 30$_1$ receives current from charge pump node VCP via current source 32$_1$ and switch 33, which are connected in parallel. Current source 32$_1$, when enabled by control signal LV_EN from control logic 24, applies a relatively low level current I$_{soft}$ to the gate of power switch transistor 30$_1$. Current source 32$_1$ is constructed in a conventional manner, such as by an MOS transistor receiving a regulated bias voltage corresponding to the desired current level; the other current sources 32$_2$, 34 described herein are similarly constructed. As described in further detail below, the current I$_{soft}$ conducted by current source 32$_1$ is at a level sufficient to slowly turn on power switch transistor 30$_1$ and to maintain it in an on state. Switch 33, in parallel with current source 32$_1$ between charge pump node VCP and the gate of power switch transistor 30$_1$, is controlled to be turned on by an active level at control signal FRS_ON from control logic 24. For example, switch 33 may be realized by a MOS transistor of appropriate drive capability receiving control signal FRS_ON at its gate.

The gate of power switch transistor 30$_2$ according to this embodiment is driven from charge pump node VCP via controllable current sources 32$_2$ and 34, which are connected in parallel between charge pump node VCP and the gate of power switch transistor 30$_2$. Current source 32$_2$ conducts a low level current I$_{soft}$ when enabled by control signal LV_EN from control logic 24, similarly as current source 32$_1$ described above. In contrast, current source 34 operates to conduct a boost current I2 from charge pump node VCP to the gate of power switch transistor 30$_2$ when enabled by control signal FRS_ON from control logic 24. This boost current I2 conducted from charge pump node VCP to the gate of power switch transistor 30$_2$ by charge pump 34 is significantly higher than (e.g., at least 10×) the current I$_{soft}$ conducted by current source 32$_2$. For example, current I$_{soft}$ may be on the order of 1 μA, while boost current I2 may be on the order of 50 to 100 μA. However, as opposed to the current conducted by switch 33, this higher current I2 is limited to a controlled magnitude, such as controlled by a regulated bias level applied to current source 34. The effect of current source 34 is thus to accelerate the turn-on of power switch transistor $30_2$ from that attainable from current source $32_2$ alone, but in a controlled manner to throttle the current conducted by power switch transistor $30_2$ when first turned on and thus limit the in-rush current of that transient.

As described above, the current applied by switch 33 to the gate of power switch transistor $30_1$ from charge pump node VCP is not controlled or regulated, as is the boost current I2 provided by current source 34 to the gate of power switch transistor $30_2$. Also, the throttling of the current from the internal V_SRC conductor to the VBUS terminal at transistor $30_2$ will limit the in-rush current at transistor $30_1$, allowing the simpler implementation of a switch at the gate of transistor $30_1$ rather than a current source.

Figure 4:
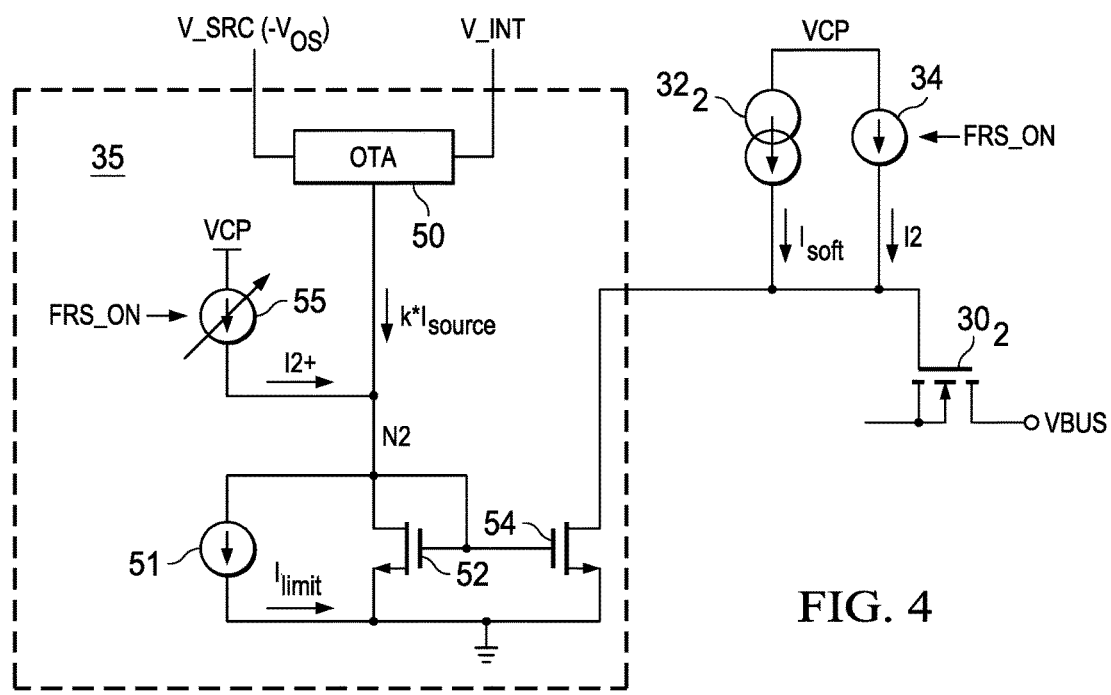
FIG. 4 is an electrical diagram, in block and schematic form, of a current limit circuit in the power switching circuitry of FIG. 3 according to that embodiment.

FIG. 4 illustrates the construction of current limit circuit 35 according to an embodiment. In this embodiment, current limit circuit 35 includes operational transconductance amplifier (OTA) 50, which may be constructed in the conventional manner. OTA 50 receives the voltage at the V_SRC conductor (less the offset voltage $V_{OS}$) at one input and the voltage at the VINT node between power switch transistors $30_1$ and $30_2$ at another input, and produces an output current corresponding to the differential voltage at its inputs. In this embodiment, that differential voltage corresponds to the on-state voltage drop across power switch transistor $30_1$ and thus corresponds to the source current $I_{source}$ conducted from power module 28 to the VBUS terminal. Accordingly, the output of OTA 50 is a current $k*I_{source}$ that corresponds to that source current $I_{source}$ conducted by power transistor $30_1$, scaled by a multiplicative constant k (e.g., k=0.1) according to the design of OTA 50.

The current $k*I_{source}$ output by OTA 50 is applied to the drain (and gate) of n-channel MOS transistor 52 at node N2; the source of transistor 52 is at ground. Transistor 52 constitutes one leg of a current mirror that has n-channel MOS transistor 54 in its other leg. Transistor 54 has its gate connected to the gate and drain of transistor 52, its source at ground, and its drain connected to the gate of power switch transistor $30_2$. Transistors 52 and 54 are usually scaled in current drive (i.e., W/L ratio) relative to one another, such as a ratio of 1:4 with transistor 54 being the larger. In any case, transistors 52, 54 have the same gate-to-source voltage as one another, and accordingly the current conducted by transistor 52 is mirrored at transistor 54.

Limit current source 51 is a conventional current source connected in parallel with transistor 52 between node N2 and ground. Limit current source 51 may be constructed in the conventional manner for a current source, such as an MOS transistor with a gate receiving a regulated bias voltage. In this embodiment, current source 51 is biased to conduct a controlled current $I_{limit}$. This current $I_{limit}$ is a limit that may be programmed or adjusted, such as according to the contents of a configuration register in control logic 42. The current $I_{limit}$ establishes the current level at which current limit circuit 35 reduces the gate drive to power switch transistor $30_2$.

Also according to this embodiment, current limit circuit 35 includes programmable compensation current source 55 connected between a high voltage, such as the voltage at charge pump node VCP, and node N2 at the drain and gate of transistor 52. When enabled by control signal FRS_ON, compensation current source 55 is biased to conduct a compensation current I2+ from charge pump node VCP and node N2 that is added with the current $k*I_{source}$ and applied to the parallel combination of transistor 52 and limit current source 51. The bias applied to compensation current source 55, and thus the magnitude of compensation current I2+, may be programmed or adjusted, such as according to the contents of a configuration register in control logic 42. When not enabled by control signal FRS_ON, compensation current source 55 is turned off and supplies no current to node N2.

In operation, OTA 50 of current limit circuit 35 applies to node N2 a current $k*I_{source}$ corresponding to the current $I_{source}$ conducted by power switch transistor $30_1$, as measured by the voltage drop across the source/drain path of that transistor $30_1$. In the normal mode (control signal FRS_ON de-asserted and current source 55 disabled), if current $k*I_{source}$ that exceeds the current $I_{limit}$ of current source 51, the excess current is conducted by transistor 52 and mirrored by transistor 54 to draw current from the gate of power switch transistor $30_2$. In this normal mode, therefore, current limit circuit 35 reduces the gate voltage at power switch transistor $30_2$ if the current $I_{source}$ conducted from internal V_SNK node to the VBUS terminal exceeds the applicable limit, to regulate the current conducted by power switch transistor $30_2$ to the desired limit.

As described above, in the normal mode (control signal FRS_ON de-asserted), current source $32_2$ supplies current $I_{soft}$ to the gate of power switch transistor $30_2$. Because this current $I_{soft}$ is also conducted by transistor 54 after the gate of transistor $30_2$ is charged, error is introduced into the operation of power switch circuit 35. But because this current $I_{soft}$ is relatively small (e.g., ~1 µA), the amount of this error in normal mode is relatively small.

However, in the event of a fast role swap, current source 34 is also driving the gate of power switch transistor $30_2$ with boost current I2. After the gate of power switch transistor $30_2$ is fully charged and transistor $30_2$ is on, this boost current I2 from current source 34 is conducted by transistor 54. If not compensated, the relatively large magnitude of boost current I2 (e.g., 50 to 100 µA) would significantly increase the magnitude of current $I_{source}$ required to turn off power switch transistor $30_2$. However, according to this embodiment, compensation current source 55 is also turned on by control signal FRS_ON during fast role swap operation, to apply compensation current I2+ to node N2. Compensation current I2+ is selected to correspond to the current I2 from current source 34, considering the scaling of transistors 52 and 54 relative to one another. In this fast role swap mode, therefore, the current mirror of transistors 52 and 54 is balanced by compensation current I2+ and boost current I2, respectively. In response to the sum of the $k*I_{source}$ and I2+ exceeding the current limit $I_{limit}$ by an amount exceeds the scaled sum of the $I_{soft}$ and I2 currents, transistor 54 conducts additional current by the action of the current mirror to pull the gate of power switch transistor $30_2$ toward ground and turn the device off. Accordingly, compensation current source 55 operates during fast role swap to compensate for the additional current I2 applied to the gate of power switch transistor $30_2$ to effect the fast role swap, ensuring that current limit circuit 35 properly regulates the source current $I_{source}$ conducted through power switch 30 to the VBUS terminal. As a result, the current limit enforced by circuit 35 is effectively increased during a fast role swap, which permits a wide range of USB-C hubs and potential accessories to be supported by host device 20.

Alternatively, compensation current source 55 may be omitted from current limit circuit 35 if the resulting error from the addition of current I2 into the current mirror is tolerable. This omission will likely depend on the size of current I2 as applied in the fast role swap operation.

Figure 5:
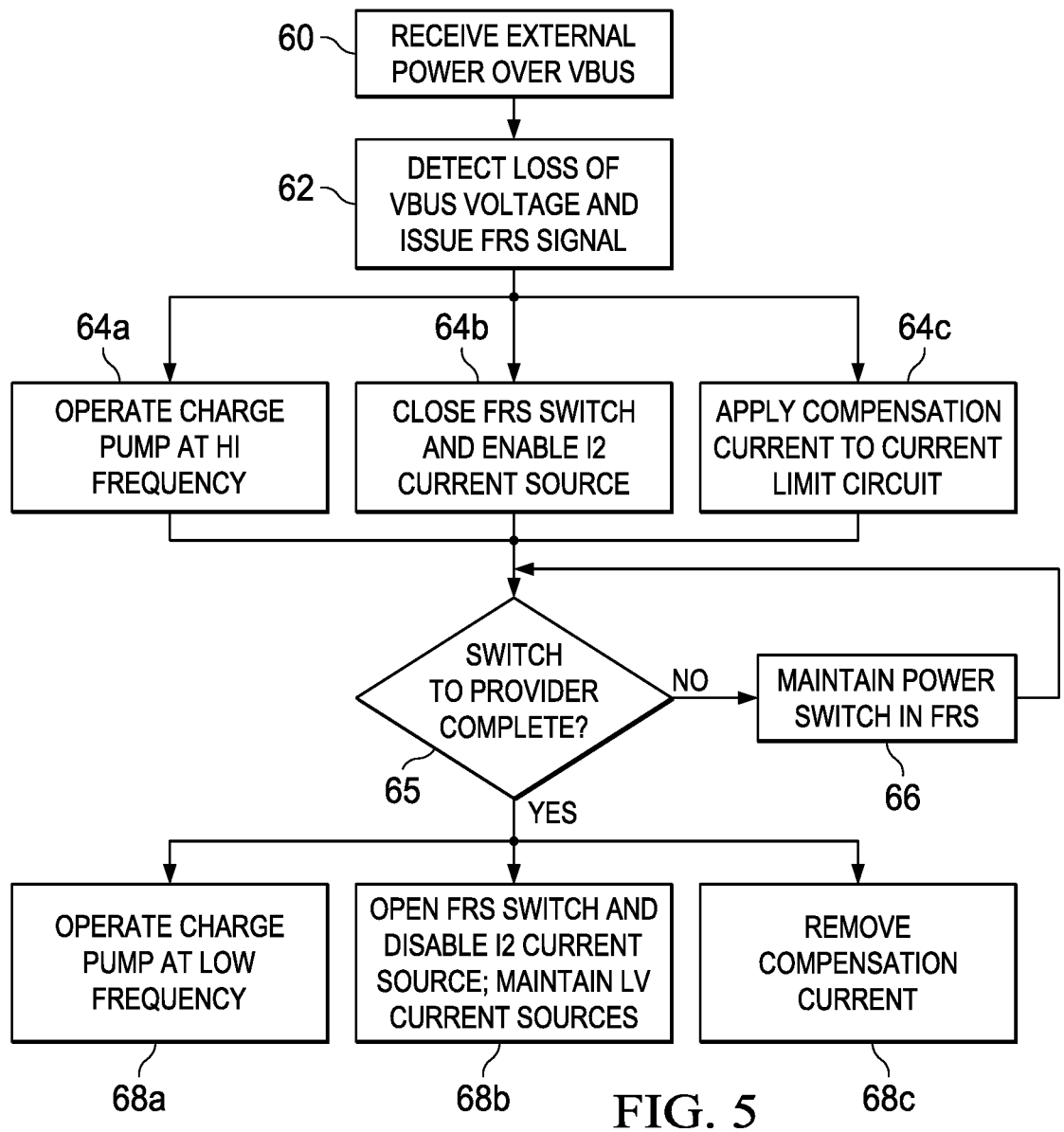
FIG. 5 is a flow diagram illustrating the operation of the power switching circuitry of FIG. 3 according to an embodiment.

FIG. 5 illustrates the operation of USB Type C (USB-C) interface 25 in changing its power delivery role from being a power consumer to being a power provider. For example, this role swap event can occur if an external power source is removed while an accessory device remains connected to the USB-C connector of a battery-powered device, as described above for the conventional situation of FIGS. 1A and 1B. Accordingly, the operation illustrated in FIG. 5 begins with process 60, in which host device 20 is receiving external power over the VBUS line of USB-C connector 22 from an external power source; this external power is useful to charge battery 23 via battery charger and switch 27 (FIG. 2).

In process 62, a USB-C hub or other device (including host device 20 itself) detects the loss of voltage on the VBUS line, such as removal of an external power source. For example, according to the above-incorporated USB PD standard, a hub device connected to USB-C connector 22 of host device 20 may detect the voltage on the VBUS line falling below a safe limit ($V_{safe}$) because only power consumers remain connected to the VBUS line. In response, the hub device or other device generates (e.g., issues) a "fast role swap" signal over the channel configuration lines CC1, CC2 of the USB-C bus, according to that standard.

Control logic 42 of configuration channel controller 24 of host device 20 detects the fast role swap signal at the channel configuration terminals CC1, CC2 of its interface 22, and responds by executing processes 64a, 64b, 64c according to this embodiment. These processes 64a, 64b, 64c may be executed effectively simultaneously, or in a logical sequence as appropriate for each particular implementation. In process 64a, control logic 42 issues the FRS_f clock signal (or control signal, as applicable) to cause charge pump 40 to operate at a higher frequency to source additional current at charge pump node VCP. Also at this time, control logic 42 asserts the FRS_ON control signal, which in process 64b closes switch 33 between the charge pump node VCP and the gate of power switch transistor $30_1$ and enables current source 34 to apply boost current I2 to the gate of power switch transistor $30_2$. The additional current applied from charge pump node VCP via switch 33 and current source 34 has the effect of turning on power switch transistors $30_1$, $30_2$, respectively, at a much faster rate in a fast role swap. In this manner, the internal power source of host device 20 (i.e., battery 23) rapidly provides power to accessory devices attached to USB-C connector 22, with minimal interruption.

In process 64c, the assertion of the FRS_ON control signal by control logic 42 also operates to enable compensation current source 55 in current limit circuit 35 as described above relative to FIG. 4. As a result, current limit circuit 35 continues to accurately monitor the source current $I_{source}$ being provided by battery 23 via power module 28 to external devices over the VBUS line at connector 22, reducing the gate voltage at power switch transistor $30_2$ in the event of an overcurrent condition.

In decision 65, host device 20 itself or a hub device connected at connector 22 determines whether host device 20 has successfully changed its role from that of a power consumer to a power provider. For example, decision 65 may be performed by comparing the voltage at the VBUS terminal of connector 22 to a safe limit ($V_{safe}$). So long as the VBUS voltage has not yet reached this desired minimum level (decision 65 returns a "no" result), operation in the fast role swap mode is maintained (process 66). However, after the voltage at the VBUS line reaches the desired level (decision 65 is "yes"), the fast role swap operation can be terminated, and a normal operating mode can be entered.

Referring to FIGS. 3 and 4, this normal operating mode includes, in process 68a, control logic 42 de-asserting the FRS_f signal and issuing the clock or control signal on line FRS_f; reducing the switching frequency of charge pump 40, which reduces its current output and reduces the power consumption of host device 20 accordingly. In process 68b, the FRS_ON control signal is de-asserted, which opens switch 33 at the gate of power switch transistor $30_1$ and disables current source 34 at the gate of power switch transistor $30_2$. Current sources $32_1$, $32_2$ remain enabled, providing the lower current $I_{soft}$ to the gates of transistors $30_1$, $30_2$, respectively, to maintain those devices in the on-state. Power module 28 is thus able to continue powering the external accessory devices over the USB-C connection. And in process 68c according to this embodiment, compensation current source 55 in current limit switch 35 is disabled, maintaining the accuracy of the current limit monitoring operation in light of current I2 no longer being applied to the gate of power switch transistor $30_2$. Alternatively, if a lower compensation current (i.e., corresponding to current $I_{soft}$) is desired, process 68c may change the magnitude of the additional compensation current applied to node N2 in this normal operating mode.

According to these embodiments, interface circuitry for an electronic device can rapidly change from receiving external power (such as to charge an internal battery) to providing power to an external device from its internal power source (such as a battery). This ability is provided in a controlled manner to avoid excess in-rush current at the power switch transistors, thus reducing switching transients in the interconnected system.

Modifications are possible in the described embodiments, and other embodiments are possible, within the scope of the claims.

What is claimed is:

1. A power switch circuit, comprising:
   a first power terminal;
   a second power terminal;
   a power switch transistor having a control terminals and a conduction path, the conduction path coupled between the first power terminal and the second power terminal;
   a charge pump having a charge pump input and a charge pump output, the charge pump configured to generate a voltage at the charge pump output by operating at a first frequency responsive to a first selection signal at the charge pump input or by operating at a second frequency responsive to a second selection signal at the charge pump input, the second frequency higher than the first frequency;
   a current source coupled between the charge pump output and the control terminal, the current source configured to apply a current to the control terminal;
   a boost current source coupled between the charge pump output and the control terminal, the boost current source having a boost control input and configured to apply a boost current to the control terminal responsive to a boost signal at the boost control input; and
   control logic having a control logic input and first and second control logic outputs, the first control logic output coupled to the charge pump input, the second control logic output coupled to the boost control input, and the control logic configured to:
      responsive to a mode signal at the control logic input, provide the first selection signal at the first control logic output; and responsive to a role swap signal at the control logic input, provide the second selection signal at the first control logic output, and provide the boost signal at the second control logic output.

2. The circuit of claim 1, further comprising:
a current limit circuit having: an input configured to receive a signal corresponding to a power current conducted between the first and second power terminals; and an output coupled to the control terminal; the current limit circuit configured to conduct current from the control terminal responsive to the power current exceeding a current limit.

3. The circuit of claim 2, wherein the current limit circuit includes:
a first mirror transistor having a conduction path configured to conduct an input current corresponding to a difference between the power current and the current limit; and
a second mirror transistor having: a conduction path coupled between the control terminal and a reference voltage terminal; and a control terminal coupled to the first mirror transistor; the second mirror transistor configured to turn on responsive to the input current exceeding the current limit.

4. The circuit of claim 3, wherein the current limit circuit includes:
a compensation current source configured to apply a compensation current, corresponding to the boost current, to the conduction path of the first mirror transistor responsive to the control logic receiving the role swap signal.

5. The circuit of claim 1, wherein the power switch transistor is a first power switch transistor, the control terminal is a first control terminal, the current source is a first current source, the current is a first current, and the circuit further comprises:
a second power switch transistor having: a conduction path coupled between the conduction path of the first power switch transistor and the second power terminal; and a second control terminal;
a second current source configured to apply a second current from the charge pump output to the second control terminal; and
a switch coupled between the charge pump output and the second control terminal, the switch configured to close responsive to the control logic receiving the role swap signal.

6. The circuit of claim 5, wherein the first and second power switch transistors are field effect transistors, and further comprising a current limit circuit including:
a differential amplifier configured to produce a sense current corresponding to a difference in voltage across the conduction path of the second power switch transistor;
a first mirror transistor having a source/drain path and a gate configured to receive the sense current;
a current limit current source coupled in parallel with the source/drain path of the first mirror transistor, the current limit current source configured to conduct a limit current;
a compensation current source configured to apply a compensation current, corresponding to the boost current, to the source/drain path of the first mirror transistor responsive to the control logic receiving the role swap signal; and
a second mirror transistor having: a source/drain path coupled between the first control terminal and a reference voltage terminal; and a gate coupled to the gate and drain of the first mirror transistor.

7. A method of controlling a power switch at an interface of an electronic device, the method comprising:
in response to a voltage at a first power terminal falling below a safe limit:
operating a charge pump at a first frequency to produce a voltage at a charge pump output; and
coupling a first controlled current, including a second controlled current, from the charge pump output to a control terminal of a power switch transistor having a conduction path coupled between the first power terminal and a second power terminal at which a power source is connected; and
in response to the voltage at the first power terminal reaching a particular level:
operating the charge pump at a second frequency, lower than the first frequency; and disabling the second controlled current to reduce the first controlled current from the charge pump output to the control terminal.

8. The method of claim 7, wherein the power switch transistor is a first power switch transistor, the control terminal is a first control terminal, and the method further comprises:
responsive to the voltage at the first power terminal falling below the safe limit, closing a switch between the charge pump output and a second control terminal of a second power switch transistor having a conduction path coupled in series with the conduction path of the first power switch transistor between the first power terminal and the second power terminal; and
responsive to the voltage at the first power terminal reaching the particular level:
opening the switch; and coupling a third controlled current from the charge pump output to the second control terminal.

9. The method of claim 8, further comprising:
sensing a current conducted between the first and second power terminals internal;
responsive to the sensed current exceeding a current limit, conducting current from the first control terminal; and
during the coupling of the first controlled current, increasing the current limit by an amount corresponding to the first controlled current.

10. The method of claim 9, wherein:
the sensing includes generating a sense current corresponding to a differential voltage across the second power switch transistor;
conducting current from the first control terminal includes: conducting the sense current through a first mirror transistor in parallel with a limit current source; and mirroring the current through the first mirror transistor at a second mirror transistor having its conduction path coupled between the first control terminal and a reference voltage terminal; and
increasing the current limit includes: applying a compensation current in addition to the sense current through the first mirror transistor in parallel with the limit current source.

11. The method of claim 7, further comprising:
responsive to the voltage at the first power terminal falling below the safe limit at a hub external to the electronic device, generating a role swap signal from the hub to the interface;
in which operating the charge pump at the first frequency and coupling the first controlled current are performed responsive to the role swap signal.

12. An electronic system, comprising:
a hub device including: logic configured to generate a role swap signal responsive to a disconnection of the hub device from a first power source; and interfaces that include terminals, the terminals including a power bus terminal connected in common among the interfaces, and the first power source being removably coupled to the power bus terminal; and
a host device including: a processor; a second power source; and a power switch circuit having a power terminal coupled to the power bus terminal;
the power switch circuit including:
a power switch transistor having a control terminal and a conduction path, the conduction path coupled between the power terminal and a power bus, the internal power bus coupled to the second internal power source;
a charge pump having a charge pump input and a charge pump output, the charge pump configured coupled to generate a voltage at the a charge pump output by operating at a first frequency responsive to a first selection signal at the charge pump input or by operating at a second frequency responsive to a second selection signal at the charge pump input, the second frequency higher than the first frequency;
a current source; coupled between the charge pump output node and the control terminal, the current source configured to apply a first current to the control terminal of the power twitch transistor;
a boost current source coupled between the charge pump output and the control terminal, the boost current source having a boost control input and configured to apply a boost current to the control terminal responsive to a boost signal at the boost control input; and
control logic having first and second control logic inputs and first and second control logic outputs, the second control logic input coupled to the logic, the first control logic output coupled to the charge pump input, the second control logic output coupled to the boost control input, and the control logic configured to:
responsive to a mode signal at the first control logic input, provide the first selection signal at the first control logic output; and
responsive to the role swap signal at the second control logic input, provide the second selection signal at the first control logic output, and provide the boost signal at the second control logic output.

13. The system of claim 12, wherein the power switch circuit includes:
a current limit circuit having: an input configured to receive a signal corresponding to a power current conducted between the power terminal and the power bus; and an output coupled to the control terminal;
the current limit circuit configured to conduct current from the control terminal responsive to the power current exceeding a current limit.

14. The system of claim 13, wherein the current limit circuit includes:

a first mirror transistor having a conduction path configured to conduct an input current corresponding to a difference between the power current and the current limit; and
a second mirror transistor having: a conduction path coupled between the control terminal and a reference voltage terminal; and a control terminal coupled to the first mirror transistor; the second mirror transistor configured to turn on responsive to the input current exceeding the current limit.

15. The system of claim 14, wherein the current limit circuit includes:
a compensation current source configured to apply a compensation current, corresponding to the boost current, to the conduction path of the first mirror transistor responsive to the control logic receiving the role swap signal.

16. The system of claim 12, wherein the power switch transistor is a first power switch transistor, the control terminal is a first control terminal, the current source is a first current source, the current is a first current, and the power switch circuit includes:
a second power switch transistor having: a conduction path coupled between the conduction path of the first power switch transistor and the power bus; and a second control terminal;
a second current source configured to apply a second current from the charge pump output to the second control terminal; and
a switch coupled between the charge pump output and the second control terminal, the switch configured to close is operable to be closed responsive to the control logic receiving the role swap signal.

17. The system of claim 16, wherein the first and second power switch transistors are field effect transistors, and the power switch circuit includes a current limit circuit including:
a differential amplifier configured to produce a sense current corresponding to a difference in voltage across the conduction path of the second power switch transistor;
a first mirror transistor having a source/drain path and a gate configured to receive the sense current;
a current limit current source coupled, in parallel with the source/drain path of the first mirror transistor, the current limit current source configured to conduct a limit current;
a compensation current source configured to apply a compensation current, corresponding to the boost current, to the source/drain path of the first mirror transistor responsive to the control logic receiving the role swap signal; and
a second mirror transistor having: a source/drain path coupled between the first control terminal and a reference voltage terminal; and a gate coupled to the gate and drain of the first mirror transistor.

* * * * *